United States Patent [19]

Takahashi

[11] 4,250,564
[45] Feb. 10, 1981

[54] MAGNETIC BUBBLE DRIVING DEVICE

[75] Inventor: Kousuke Takahashi, Tokyo, Japan

[73] Assignee: Nippon Electric Co., Ltd., Tokyo, Japan

[21] Appl. No.: 73,365

[22] Filed: Sep. 7, 1979

[30] Foreign Application Priority Data

Sep. 12, 1978 [JP] Japan ............................ 53-112781

[51] Int. Cl.³ .................................................. G11C 19/08
[52] U.S. Cl. .................................................. 365/6
[58] Field of Search ........................................ 365/6

[56] References Cited

U.S. PATENT DOCUMENTS

| | | | |
|---|---|---|---|
| 3,958,160 | 5/1976 | De Niet et al. | 365/6 |
| 4,106,088 | 8/1978 | Bergan | 365/6 |
| 4,145,750 | 3/1979 | Yoshizawa et al. | 365/6 |

OTHER PUBLICATIONS

NEC Research & Development—No. 42, Jul. 1976 pp. 61-70, note FIG. 5.

*Primary Examiner*—James W. Moffitt
*Attorney, Agent, or Firm*—Fitzpatrick, Cella, Harper & Scinto

[57] ABSTRACT

A magnetic bubble driving device produces a rotating magnetic field for a magnetic bubble memory unit by using two coils wound orthogonally to each other and cylindrically around the memory unit and by using driving circuitry for driving the coils with trapezoidally-shaped currents which are ¼ period out of phase with each other. A novel switch control mechanism is provided to produce efficient periodic coil currents by non-resonant circuit means. Each drive coil is connected to terinals $T_1$ and $T_2$ of a four terminal electrical bridge network ($T_1$, $T_2$, $T_3$, $T_4$) wherein each leg comprises a parallel coupling of a switch and a clamping diode and wherein an external source of potential is applied across terminals $T_3$ and $T_4$. Each switch opens and closes independently under the influence of a separate control signal. In one embodiment, a delay element and an OR-gate are used to derive the separate electrical control signal of one switch from the control signal of another switch. In another embodiment, control signals for each switch are separately stored in digital form at different storage locations of a read only memory (ROM).

10 Claims, 15 Drawing Figures

MAGNETIC BUBBLE DRIVING DEVICE

BACKGROUND OF THE INVENTION

1. Field of the Invention

The present invention relates to a magnetic bubble driving device for producing a rotating magnetic field in a magnetic bubble memory unit.

2. Description of the Prior Art

A rotating magnetic field is indispensable for the propagation, transfer, and expansion of magnetic bubble domains which correspond to binary bits '1' or '0' in a magnetic bubble memory. For details of such a rotating magnetic field, reference is made to a paper by Frantz Navratil, entitled "Generation and Fast Switching of High Frequency Rotating Fields for Bubble Memories," IEEE Transactions on Magnetics, Vol. MAG-11, No. 5, September issue, 1975, pp. 1154–1156.

As stated in the Navratil paper, a rotating magnetic field can be developed for use in a bubble driving device by supplying periodic coil currents which are ¼-period out of phase with each other, respectively, to a couple of drive coils wound orthogonally to each other and cylindrically around a bubble memory unit comprising at least one memory chip. Sinusoidal or triangular shaped waveforms, for example, may be used in such an arrangement.

Generally, the coils are driven by sinusoidal currents produced by LC resonance circuits, each comprising a coupling of a drive coil and a capacitor connected in parallel. Since each resonance circuit typically employs a current switch in series with the drive coil for the start-stop operation of the coil current, however, a relatively large amount of attenuation of the sinusoidal coil current occurs due to resistance loss. In order to avoid such deterioration in the coil current waveform, an excitation switch is added for each resonance circuit to provide loss compensation and to boost the voltage across the capacitor at each half period to approximately that of the positive or negative initial voltage. Consequently, two or more power supply sources are necessary to maintain these positive or negative initial voltage levels. Furthermore, in order that the resonance frequency of each LC circuit is in synchronism with the operating frequency of the excitation switch, the capacitance of the capacitor in each resonance circuit must be suitably adjusted. Also, troublesome timing control is required after the power supply sources are turned on or at the time of the driving initiation of the coil currents, in order to set the potential across each capacitor to a given initial value. Such requirements complicate the circuit construction of each resonance circuit. Despite these disadvantages, however, such resonant circuits have been the predominant means used for driving a rotating magnetic field in a bubble memory, since conventional bubble memories have been developed to adapt to such sinusoidal driving currents.

Recently, non-resonance circuits, each of which has a simple structure comprised of switches and diodes, have been used to produce rotating magnetic fields by means of triangular wave drive coil currents. Such circuits allow not only easy start-stop control of the coil currents but also allow the use of a single power supply source. For these reasons, it is preferable to adapt bubble memory structures to use driving devices powered by triangular coil currents. The use of this type of driving device having no resonance capacitors is especially desirable when the device is to be fabricated on a substrate by IC (integration circuit) technology for size minimization.

Theoretically, in such triangular coil current driving systems, each coil current has an ideal triangular waveform, i.e. the current rises linearly from 0 to $I_L$ during the first ¼ period and then falls linearly from $I_L$ to 0 during the next ¼ period. Thus, one coil current with such an ideal triangular waveform when combined with another one shifted ¼ period out of phase from the first forms a diamond-shaped Lissajous' figure. If the amplitude of a circle internally contacting the resulting diamond-shaped Lissajous' figure corresponds to $I_R$, $I_R$ is given as follows:

$$I_R = I_L/\sqrt{2} \tag{1}$$

Therefore, with such a triangular waveform system, even if each coil current follows an ideal triangular waveform, the amplitude in any direction of the Lissajous' figure lies between $I_R$ (minimum amplitude) and $I_L$ (maximum amplitude). Therefore, driving efficiency, defined as the ratio of $I_R$ to $I_L$, using such ideal triangular coil currents cannot be enhanced to a value greater than $1/\sqrt{2}=0.7$ as seen from equation (1). As a result, power consumption and induction noises affecting the sense system are greater than with sinusoidal coil currents.

In conventional driving devices using triangular waveform drive currents, the rise time $T_r$ is not always the same as the fall time $T_f$. Particularly when the rise time $T_r(=T_o/4)$ is not sufficiently smaller than the time constant L/R, the fall time $T_f$ will be less than the rise time $T_r$; where $T_o$ represents the driving period (the inverse of the driving frequency), L the inductance of the driving coil, and R the resistance of the coil. Consequently, the driving efficiency drops to 0.6, or less, resulting in additional increases in amplitude variation, sense noise, and power consumption.

Accordingly, one object of the present invention is to provide a magnetic bubble driving device which is free from the above-mentioned and other disadvantages of conventional systems.

SUMMARY OF THE INVENTION

According to the invention there are provided novel control circuit arrangements in a magnetic bubble driving device of the type which includes driving circuits each having a driving coil wound around bubble memory unit for producing a rotating magnetic field to the memory unit and a pulse generator for controlling the operation of said driving circuits so that they produce periodic coil currents whose phases are different. The driving circuits are of the type which comprise first, second, third and fourth switches and associated clamping diodes forming a network between voltage source terminals, and terminals of the driving coil to direct current in different directions through the coil according to the selective opening and closing of said switches. These novel control circuit arrangements comprise a control circuit connected to receive control signals from the pulse generator and to operate said switches in response thereto, such that said first and fourth switches are both closed for a first duration during which a coil current flows from said first to said second drive coil terminal and such that one of said first and fourth switches is opened at the end of said first duration and the other switch is opened at a finite time thereafter; and a second control circuit also connected to receive said control signals and to operate said switches in response thereto, such that said second and third switches are both closed for a second duration during which a coil current flows from said second to said first drive coil terminal and such that one of said second and third switches is opened at the end of said second duration and the other switch is opened at a finite time thereafter, whereby each said coil current has a trapezoidal waveshape. The finite time after each duration is chosen such that the fall time of the resulting coil current is the same as the rise time of said current, whereby the trapezoidal waveform is made continuous.

BRIEF DESCRIPTION OF THE DRAWINGS

The invention will become more apparent from the following detailed description when taken in conjunction with the accompanying drawings, in which.

Throughout the drawings, like elements are referred to by like reference numerals.

DETAILED DESCRIPTION OF THE PREFERRED EMBODIMENT

In order that the invention may be more easily presented in such full, clear, concise and exact terms as to readily enable a person skilled in the art to make and use the same, the detailed description of the preferred embodiment of the invention is preceded by a detailed description of a typical prior art embodiment.

a. Prior Art

Figure 1A:
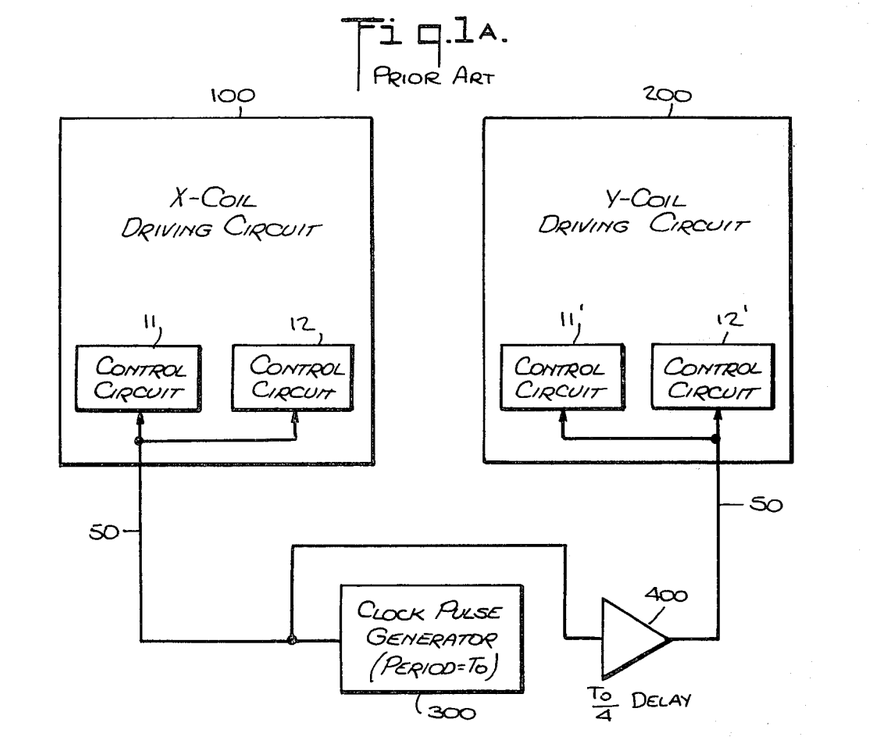
FIG. 1A shows a block diagram of a conventional prior art magnetic bubble driving device for producing X-coil and Y-coil currents of triangular waveform.

Referring to FIG. 1A, a conventional magnetic bubble driving device comprises a pair of X-coil and Y-coil current driving circuits 100 and 200 having control circuits 11, 12 and 11', 12', respectively; a clock pulse generator 300 having a repetition period of $T_o$; and delay means, such as buffer 400, to provide a delay of $\frac{1}{4}$ $T_o$, so that triangular-shaped X-coil and Y-coil currents may be produced to apply a rotating magnetic field to a magnetic bubble memory unit (not shown).

Figure 1B:
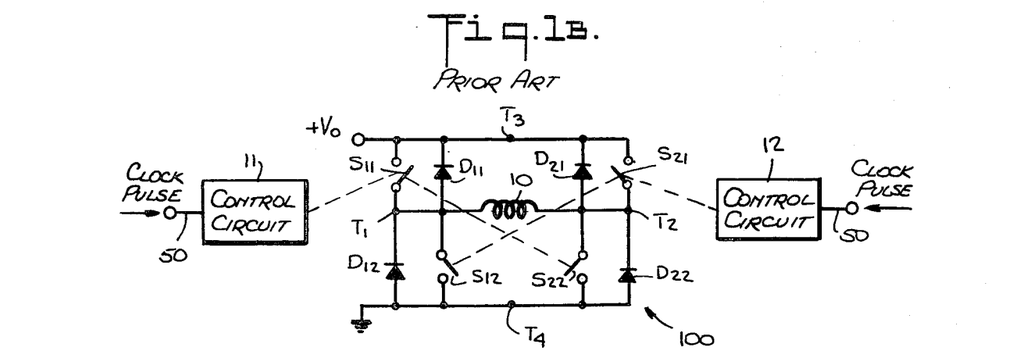
FIG. 1B shows a schematic circuit diagram of the X-coil driving circuit of FIG. 1A.

Referring to FIG. 1B which shows the X-coil current driving circuit 100, on the left side as viewed in the figure, a first switch $S_{11}$ and a first clamping diode $D_{11}$ are connected in parallel between a voltage source $+V_o$ and a first terminal $T_1$, of a four terminal electric network (T1, T2, T3, T4). Similarly, on the right side of FIG. 1B, a second switch $S_{21}$ and a second clamping diode $D_{21}$ are connected in parallel between the voltage source $+V_o$ (third terminal $T_3$) and a second terminal $T_2$. Further, a third switch $S_{12}$ and a third clamping diode $D_{12}$ are connected in parallel between a ground (fourth terminal $T_4$) and the first terminal $T_1$. Similarly, a fourth switch $S_{22}$ and a fourth clamping diode $D_{22}$ are connected in parallel between ground and the second terminal $T_2$. Magnetic field generating coil 10 is connected between terminals $T_1$ and $T_2$. As shown, all clamping diodes are positioned with their cathode electrodes facing the voltage source $+V_o$ and their anode electrodes facing the ground.

The described X-coil driving circuit thus generally comprises a four-terminal electrical network bridge ($T_1$, $T_2$, $T_3$, $T_4$) wherein each leg comprises a parallel coupling of a switch and a clamping diode, wherein the drive coil is connected across the central terminals $T_1$ and $T_2$, and wherein a source of potential from an external source is connected across the upper and lower terminals $T_3$ and $T_4$.

The driving circuit 100 is further provided with first and second control circuits 11 and 12 electrically connected to clock pulse generator 300 via signal line 50 (see FIG. 1A). The first control circuit 11 is connected in suitable fashion to control the ON-OFF (i.e. CLOSE-OPEN) operation of switches $S_{11}$ and $S_{22}$ which are interlocked to open and close with each other in synchronism with the clock pulses received from clock pulse generator 300 over the signal line 50. The second control circuit 12 similarly controls the ON-OFF operation of the switches $S_{12}$ and $S_{21}$ which are interlocked to open and close with each other in like manner. Through the switching operation, a triangular waveform current is produced in the drive coil 10. A conventional magnetic bubble driving device of this type is discussed in detail in a paper by Kazuo Yamagishi, et al., entitled "A New Proposal on Field-Access Bubble Drives," IEEE Transactions on Magnetics, Vol. MAG-11, No. 1, January 1975, pp. 16–20.

Figure 2:
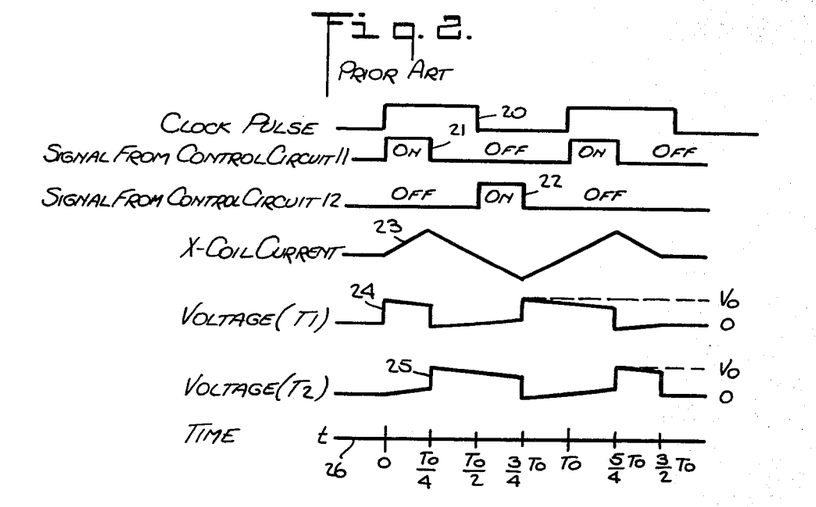
FIG. 2 shows waveforms illustrating the operation of the circuit shown in FIG. 1B.

The operation of the driving circuit of FIG. 1B is illustrated by the waveforms shown in FIG. 2. Waveform 20 shows a clock pulse signal of period $T_o$, such as generated by clock pulse generator 300; and waveforms 21 and 22 show signals from the control circuit 11 and 12 which control the opening and closing of interlocked switches $S_{11}$, $S_{22}$ and interlocked switches $S_{12}$, $S_{21}$, respectively. A current flowing through the drive coil 10 as a result of these control signals takes on a waveform as denoted by 23. Voltages appearing at the first and second terminals $T_1$ and $T_2$ are shown by waveforms 24 and 25, respectively. Reference numeral 26 is a time scale based on a period $T_o$.

When the control signal represented by the waveform 21 changes to an ON-state, both switches $S_{11}$ and $S_{22}$ are simultaneously closed. At this point in time, the voltage at the first terminal $T_1$ of the drive coil 10 becomes $+V_o$ while the voltage at the second terminal $T_2$ becomes ground potential. Therefore, coil current flows in a positive direction through the coil 10, i.e., from the first terminal $T_1$ to the second terminal $T_2$. If the time duration $T_o/4$ of the ON-state of the control signal 21 is sufficiently small compared to the time constant $L/R$ of the drive coil 10, the coil current increases substantially linearly to reach an amplitude $$I_L = \frac{T_o}{4} \times \frac{V_o}{L} \text{ at time } t = T_o/4, \text{ taking an amplitude}$$
$$\frac{V_o}{R} \text{ at time } \frac{L}{R}.$$

When signal 21 changes to an OFF-state, switches $S_{11}$ and $S_{22}$ are simultaneously opened. When this happens, a magnetic inertia is exerted on drive coil 10 to maintain the positive direction flow of coil current of amplitude $I_L$, with the result that a large negative inverse voltage is induced at the first terminal $T_1$ and a large positive inverse voltage is induced at the second terminal $T_2$. However, the first terminal $T_1$ is clamped to ground potential by the diode $D_{12}$ and the second terminal $T_2$ is clamped to $+V_o$ by the diode $D_{21}$. Consequently, a negative stop voltage $-V_o$ is applied across the driving coil 10. As a result, a negative direction coil current, i.e. from the second terminal $T_2$ to the first terminal $T_1$, is caused to flow through the drive coil 10 in response to the step voltage $-V_o$; and this negative direction is added to the above described positive flowing coil current. A positive direction coil current $I_1(t)$ produced in response to the removal of voltage $+V_o$ when the switches $S_{11}$ and $S_{22}$ are opened, and a negative direction coil current $I_2(t)$ produced in response to the step voltage $-V_o$ can be expressed in terms of time as follows:

$$I_1(t) = I_L - K\frac{V_o}{L} t, \quad I_2(t) = \frac{-V_o}{L} t; \quad (2)$$

with $t=0$ taken to be the time at which the switches $S_{11}$ and $S_{22}$ are opened and where $$K = \frac{T_o}{4} (L/R).$$

Thus, from equation (2), the net coil current $I_3(t)$ which is the sum of the positive and negative currents $I_1(t)$ and $I_2(t)$, can be expressed in terms of time as follows:

$$I_3(t) = I_1(t) + I_2(t) = I_L - (1 + K)\frac{V_o}{L} t \quad (3)$$

During the time when the net or summed current $I_3(t)$ is positive, the coil current flows from ground to the first voltage source $+V_o$ through the diode $D_{12}$, the driving coil 10, and diode $D_{21}$.

Substituting $I_3(t)=0$ and $$I_L = \frac{T_o}{4} \times \frac{V_o}{L}$$

into equation (3) gives the fall time $t=T_f$, as follows:

$$T_f = \frac{1}{(1+K)} \frac{(T_o)}{4} = \frac{T_r}{(1+K)} \quad (4)$$

Also, in the above equations (2) and (3), K (the ratio of rise time $T_o/4$ to time constant $L/R$) is approximately equal to the inverse of the Q factor of the drive coil, the Q factor being generally defined as $2\pi/T_o \times L/R$. Consequently, if the Q factor is sufficiently large, $K \approx 0$, and the fall time $T_f$ becomes equal to $T_o/4$ (i.e. $T_f = T_r$). When Q is smaller, K may have a value of 1 or more, and $T_f$ becomes less than $T_o/4$ (i.e. $T_f < T_r$).

When control signal 22 changes to an ON-state, switches $S_{12}$ and $S_{21}$ are simultaneously closed so as to produce a linear increase in negative direction coil current flowing through the drive coil 10. When signal 22 changes from an ON-state to an OFF-state, switches $S_{12}$ and $S_{21}$ are simultaneously opened. As a result, an inverse voltage is induced across the drive coil 10. However, since the voltage at the second terminal $T_2$ is clamped to ground potential by the fourth clamping diode $D_{22}$, and since the first terminal voltage is clamped to $+V_o$ by the first clamping diode $D_{11}$, the negative direction coil current also attenuates linearly through the diodes $D_{11}$ and $D_{22}$.

Referring to FIG. 2, at time $t=0$, control signal 21 assumes an ON-state value for the duration of ¼ period. After ½ period has elapsed (i.e. $T=T_o/2$), signal 22 assumes an ON-state value for the duration of ¼ period. After an additional ½ period has elapsed (i.e. at $t=T_o$), signal 21 again assumes an ON-state value for a further time duration of ¼ period. Through repetition of this operation, a triangular-shaped X-coil current 23 is obtained.

Figure 3:
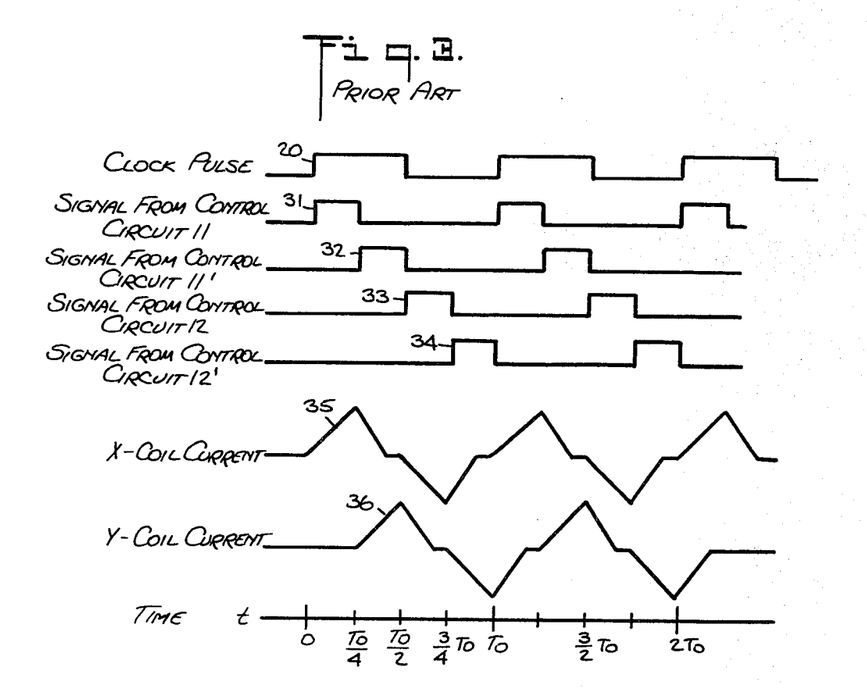
FIGS. 3 and 4 show waveforms for describing the conventional prior art methods of producing triangular-shaped drive coil currents.
Figure 4:
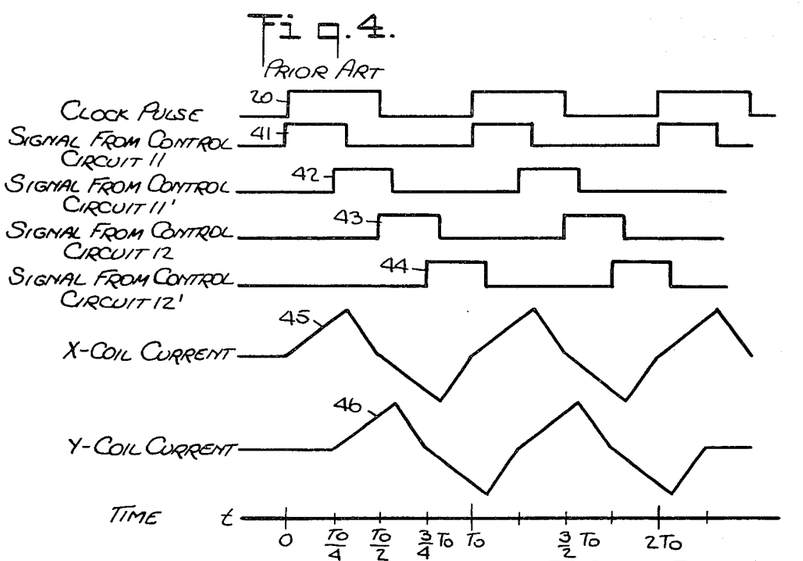

The X-coil current waveform shown in FIG. 2 is for the ideal case, and is obtained when the Q factor of the driving coil is sufficiently large for the rise time to be the same as the fall time ($T_r = T_f$). In actuality, however, the Q factor is not that large, and the fall time is shorter than the rise time ($T_f < T_r$). FIGS. 3 and 4 show two examples of actual X-coil and Y-coil currents which are ¼ period out of phase.

FIG. 3 shows a first example of conventional triangular-shaped coil currents. In FIG. 3, waveforms 31 and 32 indicate output signals of the first control circuits 11 and 11' for the X-coil current and the Y-coil current, respectively. Waveforms 33 and 34 indicate the output signals of the second control circuits 12 and 12' for the X-coil current and the Y-coil current, respectively. The signals represented by the waveforms 31 and 33 cause the X-coil current having a waveform 35 to flow. Similarly, the signals represented by the waveforms 32 and 34 cause the Y-coil current having a waveform 36 to flow. The example shown in FIG. 3 illustrates the case where the fall time of the respective positive and negative alternations of the triangular wave is shorter than the rise time (i.e. $T_f < T_r$). A comparison of waveforms 35 and 36 in FIG. 3 shows that succeeding alternations of one waveform are not begun until the preceding alternation of the other waveform reaches its associated positive or negative peak. This means that continuous triangular-shaped coil currents are not produced.

FIG. 4 shows a second example of conventional control signal timing to produce triangular-shaped coil currents. In FIG. 4, waveforms 41 and 42 denote output signals of the first control circuits 11 and 11', respectively. Waveforms 43 and 44 denote the output signals of the second control circuits 12 and 12', respectively. The signals denoted by the waveforms 41 and 43 drive the X-coil current according to a waveform 45. The signals denoted by the waveforms 42 and 44 drive the Y-coil current according to a waveform 46. In this example, the pulse widths of the waveforms 41 to 44 each have a time duration of more than ¼ period in order for positive and negative alternations of the triangular waves to be arranged continuously.

Figure 5:
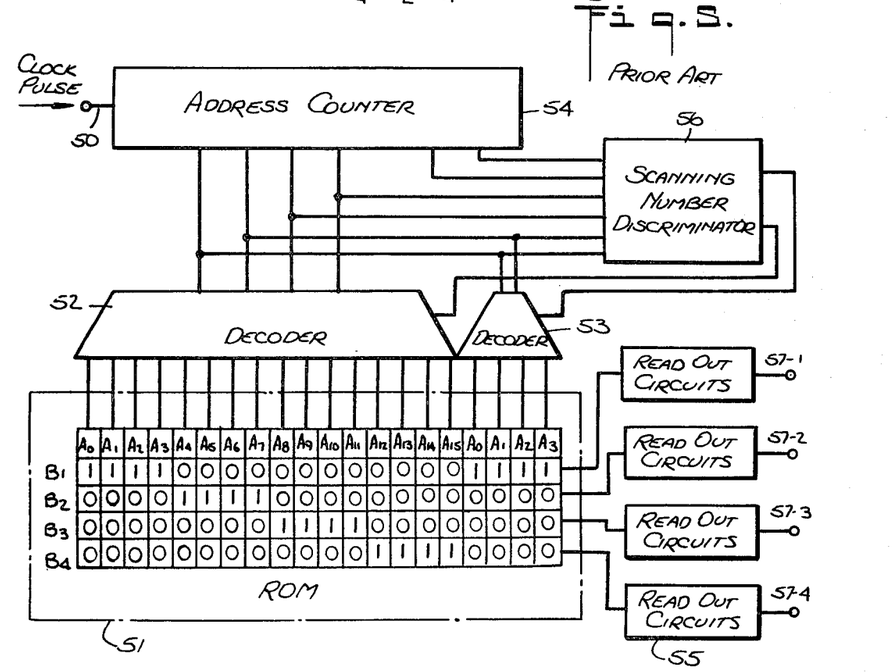
FIG. 5 shows a schematic circuit diagram for describing the control operation of the driving device of FIG. 1A.

Referring to FIG. 5, the structure of the driving device of FIG. 1A, comprising the elements 300, 11, 11', 12, and 12', is also conventionally achieved in the prior art by use of a digital logic structure comprising a read only memory (ROM) 51, decoders 52 and 53, an address counter 54 which is electrically connected to the clock pulse generator 300 by line 50 to receive clock pulses with the repetition period $T_o$, and read-out circuits 55. The read-out circuits 55 produce control signals corresponding to the waveforms 31 to 34 in FIG. 3. In particular, by repeated successive access to the addresses (A0 through A15) from 0 to 15 connected to decoder 52, binary information ('1's or '0's) stored in the four bit locations B1, B2, B3, and B4 of each address of the ROM 51 are produced through the read-out circuits 55 in the form of high level (ON) or low level (OFF) electrical signals.

It is common practice when stopping the rotating magnetic field to drive the X-coil current alone for an additional one-half period. For this purpose, after the scanning operation of the decoder 52 has been performed a given number of times, the scanning operation is shifted to a second decoder 53 that controls the X-coil current for this final half period. To this end, a scanning number discriminator 56 comprising AND gates connected in parallel is used to count the number of scans of the decoders 52 and 53. As soon as the number of scans reaches a predetermined number, an ENABLE or DISABLE signal is produced to start or stop the respective scanning operation of decoder 52 or 53. The output pulses appearing at terminals 57-1, 57-2, 57-3, and 57-4 correspond to the control signals 31 to 34 derived from the control circuits 11, 11', 12 and 12'.

Figure 6:
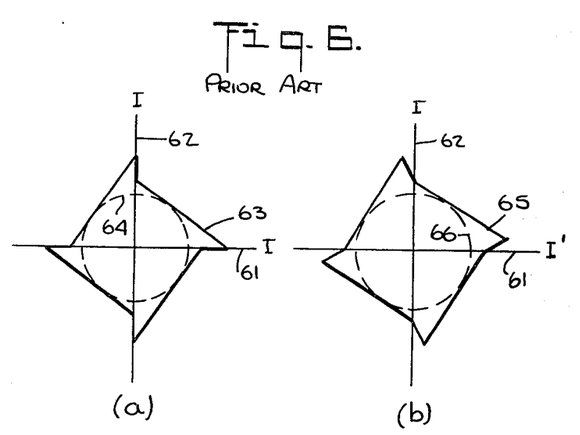
FIGS. 6(a) and 6(b) show the Lissajous' figures for the conventional coil currents shown in FIGS. 3 and 4, respectively.

FIGS. 6(a) and 6(b) show Lissajous' figures of the conventional coil currents shown in FIGS. 3 and 4. A coordinate axis 61 represents the amplitude of the X-coil current; a coordinate axis 62 represents the amplitude of the Y-coil current; and continuous lines 63 and 65 represent the respective Lissajous' figures formed by waveforms 35 and 36 of FIG. 3 and waveforms 45 and 46 of FIG. 4. Dashed lines 64 and 65 represent circular Lissajous' figures internally contacting the Lissajous' figures 63 and 65, respectively. The circular Lissajous' figures represent the portions of the coil current waveforms that effectively act to drive the bubbles in the bubble memory unit. The driving efficiencies of the coils (each expressed by the ratio of the amplitude $I_R$ of the circular Lissajous' figure to the maximum amplitude $I_L$ of the actual Lissajous' figure indicated by the continuous lines 63 and 65) are small, i.e. 0.6 or less. The amplitude of the Lissajous' figure changes greatly and irregularly as the direction (phase) of the rotating magnetic field changes. This adversely affects the operation of the magnetic bubble drive. As a result, the conventional magnetic bubble driving device tends to have a low driving efficiency.

EMBODIMENT OF THE INVENTION

Figure 7:
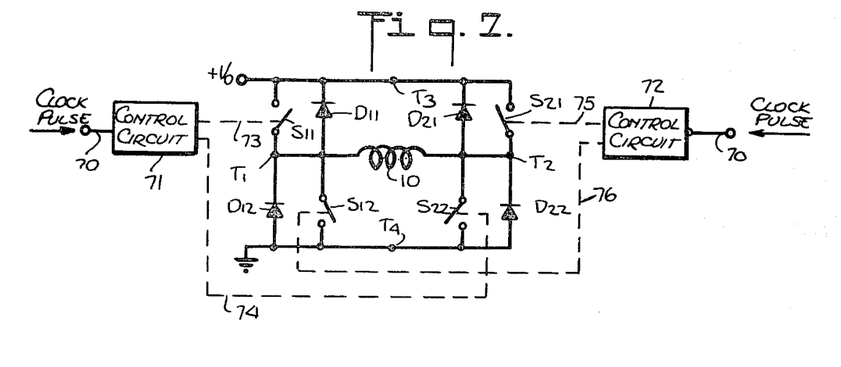
FIG. 7 shws a schematic circuit diagram illustrating one embodiment of the invention.

FIG. 7 illustrates an embodiment of the present invention. Unlike the switches in the prior art structure of FIG. 1B, the switches $S_{11}$, $S_{22}$ and the switches $S_{21}$, $S_{12}$ are not interlocked to open and close with each other in response to the same ON-OFF (i.e. CLOSE-OPEN) control signals. Each switch acts independently under its own control signal. Signal lines 73 and 74 are connected from a first control circuit 71 to the switches $S_{11}$ and $S_{22}$, respectively, and signal lines 75 and 76 are connected from a second control circuit 72 to the switches $S_{21}$ and $S_{12}$, respectively. Both first control circuit 71 and second control circuit 72 receive synchronizing clock signals of period $T_o$ (waveform 80 in FIG. 8) through electrical signal lines 70.

The operation of the driving circuit of FIG. 7 is described with reference to the waveforms shown in FIG. 8. Control signals 81 and 82 are generated in the control circuit 71 and are supplied along the signal lines 73 and 74, respectively, to operate the switches $S_{11}$ and $S_{22}$; while control signals 83 and 84 are generated in the control circuit 72 and are supplied along the signal lines 75 and 76, respectively, to operate the switches $S_{21}$ and $S_{12}$. When the signal 81 is applied to the switch $S_{11}$, the signal 82 is given to the switch $S_{22}$; and when the signal 83 is applied to the switch $S_{21}$, the signal 84 is given to switch $S_{12}$. Signals 81 and 82 are interchangeable to the signals 83 and 84 are also interchangeable. In either case, a series of switch operations in response to control signals 81 to 84 is repeated in the following sequence: both switches $S_{11}$ and $S_{22}$ in the ON-state (i.e. closed); (a) one of the switches $S_{11}$ and $S_{22}$ in the ON-state and one in the OFF-state (i.e. open); (b) both switches $S_{11}$ and $S_{22}$ in the OFF-state; (c) both switches $S_{21}$ and $S_{12}$ in the ON-state; (d) one of the switches $S_{21}$ and $S_{12}$ in the ON-state and one in the OFF-state; and (e) both switches $S_{21}$ and $S_{12}$ in the OFF-state. Applying control signals 80 to 84 thus to the circuit of FIG. 7 produces an X-coil current flow in the drive coil 10 which has a trapezoidal shape as denoted by waveform 85.

Figure 8:
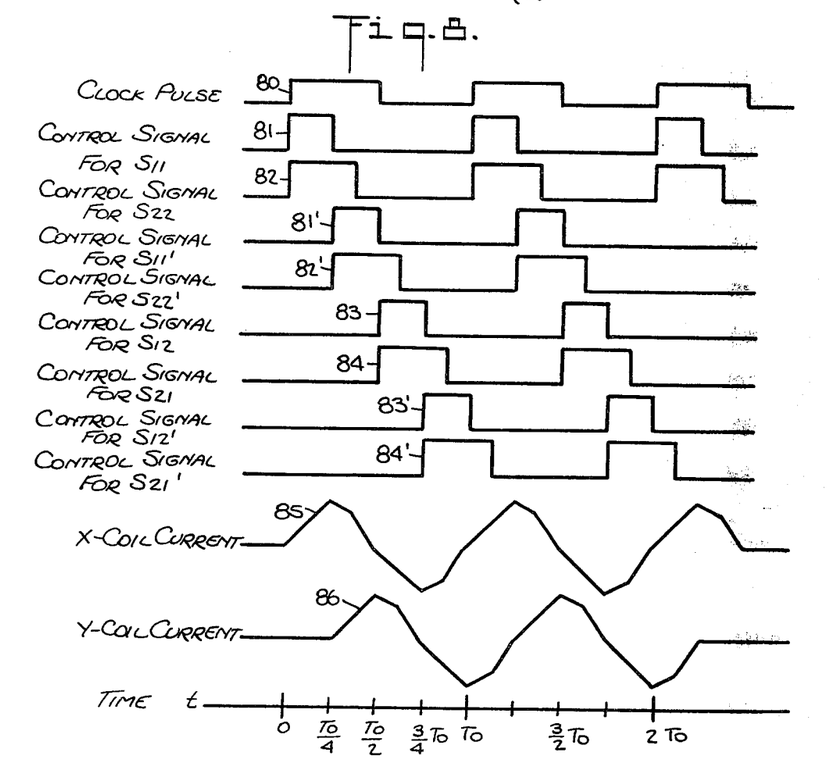
FIG. 8 shows waveforms illustrating the operation of the embodiment of the invention shown in FIG. 7.

Waveforms 81' to 84' of FIG. 8 denote control signals corresponding to waveforms 81 to 84. Signals 81' to 84' operate similarly to the waveforms 81 to 84. These control signals applied to appropriate switches of the Y-coil driving circuit produce a Y-coil current flow in the Y-coil which has a trapezoidal shape, as denoted by 86, and which is ¼ period out of phase with the X-coil current.

The waveforms 81, 82 and 81', 82' are produced by the first control circuits 71 (FIG. 7) and 71' (not shown, but having the same structure as that of the circuit 71), respectively. Waveforms 83, 84 and 83', 84' are outputs from the second control circuits 72 and 72', respectively.

Figure 9:
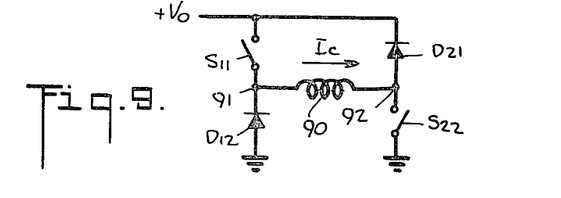
FIG. 9 shows a schematic circuit diagram illustrating the details of a portion of the device of FIG. 7.
Figure 10:
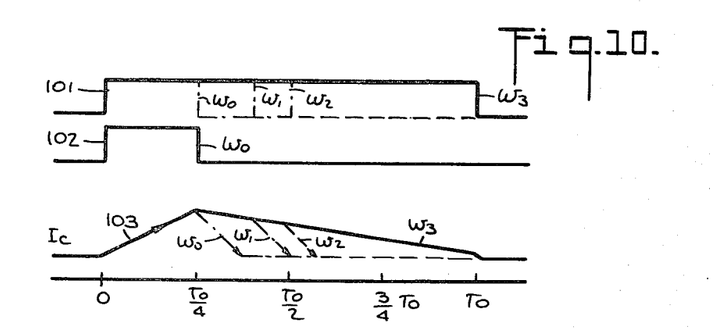
FIG. 10 shows waveforms illustrating the flow of current in the coil of FIG. 9.
Figure 11:
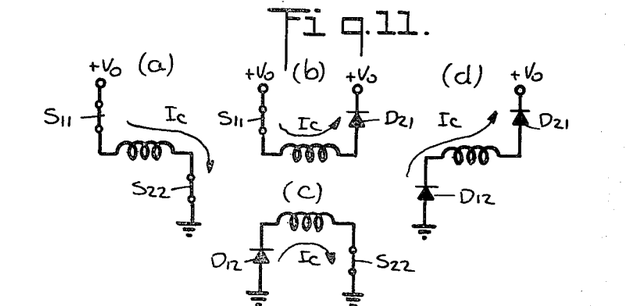
FIGS. 11(a) to 11(d) are diagrammatic illustrations of the flow of current in the circuit of FIG. 9.

Reference is made to FIGS. 9, 10 and 11 in connection with the following description of how X-coil and Y-coil currents 85 and 86 assume trapezoidal shapes.

FIG. 9 shows a schematic circuit for driving a positive coil current (i.e. from terminal $T_1$ to terminal $T_2$) in the circuit of FIG. 7. FIG. 10 shows waveforms 101 and 102 of the control signals applied from the first control circuit 71, respectively, to the switches $S_{11}$ and $S_{22}$ (in FIG. 9). In response to the signal of waveform 101 applied to the switch $S_{11}$ and the signal of waveform 102 applied to the switch $S_{22}$, a coil current $I_c$ (shown as waveform 103 in FIG. 10) flows from first terminal 91 through drive coil 90 to second terminal 92.

As the pulse width of waveform 101 is increased, the fall time of coil current $I_c$ is correspondingly extended. This is shown in FIG. 10 by the dashed lines $W_0$, $W_1$, $W_2$ and solid lines $W_3$ of waveforms 101 and 103 which show differences in the waveshape of coil current $I_c$ corresponding to differences in the duration of the ON-state of control signal 101.

If the pulse widths of waveforms 101 and 102 are equal (i.e. both have pulse durations of $T_o/4$, shown by $W_0$), the coil current fall time $T_f$ is less than the coil current rise time $T_r (=T_o/4)$, as in the case of the prior art bubble driving device of FIG. 1B (i.e. $T_f < T_r$). The coil current with signal waveform 101 ending at $W_0$ is given by $$I(t) = I_L - (1 + K)\frac{V_o}{L} t.$$

taking $t = 0$ at the fall time $W_0$ of the waveform 101.

If the pulse width of the waveform 101 is sufficiently longer than that of the waveform 102 (such as seen by $W_3$), the coil current $I(t)$ can be expressed in terms of time $t$, as $I(t) = I_L e^{-(R/L)t}$. In this case, the fall time $T_f$ is much longer than the rise time $T_r$ (i.e. $T_f \gg T_r$). If the fall time of the waveform 101 is selected at a suitable position such as $W_1$, the fall time $T_f$ which is the sum of a gentle fall time $T_{gf}$ and a steep fall time $T_{sf}$ can be made to coincide with the rise time $T_r$ (i.e. $T_f = T_r$).

FIG. 11(a) illustrates the flow of current $I_c$ through the coil 90 of FIG. 9 during current rise time (both $S_{11}$ and $S_{22}$ closed); FIGS. 11(b) and 11(c) illustrate current $I_c$ at the gentle fall time (only one of $S_{11}$ or $S_{22}$ closed); and FIG. 11(d) illustrates current $I_c$ at the steep fall time (neither $S_{11}$ nor $S_{22}$ closed). The current flow shown in FIG. 11(b) corresponds to control signal waveforms 101 and 102 being respectively applied to the switches $S_{11}$ and $S_{22}$. The current flow shown in FIG. 11(c) corresponds to control signal waveforms 101 and 102 being interchanged to be respectively applied to the switches $S_{22}$ and $S_{11}$.

In FIG. 11(a), a voltage of $+V_o$ is applied across the drive coil and the coil current $I_c$ increases from 0 to $V_o/R$ in accordance with the equation:

$$I(t) = \frac{V_o}{R}(1 - e^{-(R/L)t})$$

By restricting the rise time to $T_r = T_o/4$, the amplitude $I_L$ can be defined as $$I_L = \frac{T_o V_o}{4L}.$$

In FIGS. 11(b) and 11(c), no external voltage is supplied to the drive coil and, therefore, the coil current $I_c$ as a function of time can be expressed as follows:

$$I(t) = I_L e^{-\frac{R}{L} t}$$

As mentioned above, at gentle fall time $T_{gf}$, the coil current substantially decreases from $I_L$ to $$I_L(1 - \frac{R}{L} T_{gf}).$$

In FIG. 11(d), $-V_o$ is applied to the driving coil and therefore the coil current is given as follows:

$$I(t) = I_L(1 - \frac{R}{L} T_{gf}) - (1 + K)\frac{V_o}{L} t$$

Figure 12:
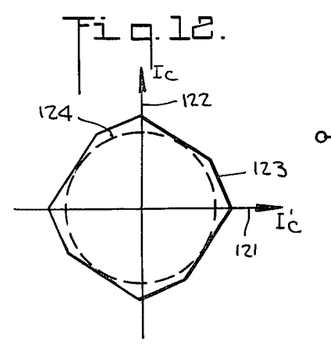
FIG. 12 shows a Lissajous' figure of trapezoidal shape characteristic of the embodiment of FIG. 7.

FIG. 12 shows a Lissajous' figure formed by two coil currents with trapezoidal waveforms such as shown for the X-coil and Y-coil in FIG. 8. A coordinate axis 121 represents the amplitude of the X-coil current. A coordinate axis 121 represents the amplitude of the Y-coil current. As shown, the Lissajous' figure takes a convex and octagonal shape because of the presence of the gentle and steep falls in the fall times of the coil currents. When the amplitude $I_R$ of a circular Lissajous' figure 124 internally contacting the octagonal Lissajous' figure 123 is compared with the maximum amplitude $I_L$ of the octagonal Lissajous' figure 123, it is seen that the amplitude $I_L$ is at most 1.2 times the amplitude $I_R$. This ratio is rather small even when K is not close to 0. This means that the driving efficiency is 0.83 or more, and that the variation in magnitude for the different rotating magnetic field directions is much smaller than the amplitude variations of conventional Lissajous' figures. Therefore, with the teachings of this invention, a relatively smooth rotating magnetic field is obtained from a non-resonant circuit having a single power supply source.

Figure 13:
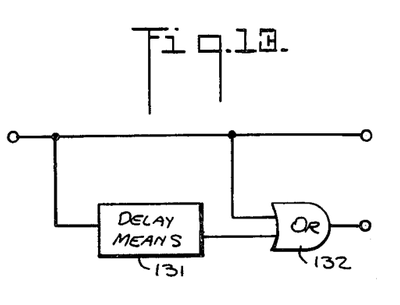
FIGS. 13 and 14 are schematic diagrams illustrating the details of portions of the device of FIG. 7.

In FIG. 13, there is shown a first form of structural element for each control circuit 71, 72 of this embodiment. The element of FIG. 13 is coupled to read-out circuits similar to those of FIG. 5 to produce eight different switch control signals. The circuit structure thus constructed produces control signals 82 and 82' on the basis of the control signals 81 and 81', and produces control signals 84 and 84' on the basis of the control signals 83 and 83'. This control signal production is performed by logically summing the signals before and after delaying by using delay means 131 of a delay time $t_d$ and an OR gate 132. With this circuit, when the delay time $t_d$ is smaller than the pulse width, the pulse width of the original signal may be widened by a given delay time to give a different signal. Such a set of two signals will cause a pair of switches to first both close and thereafter assume a state of one (remaining) closed and one (becoming) open.

Figure 14:
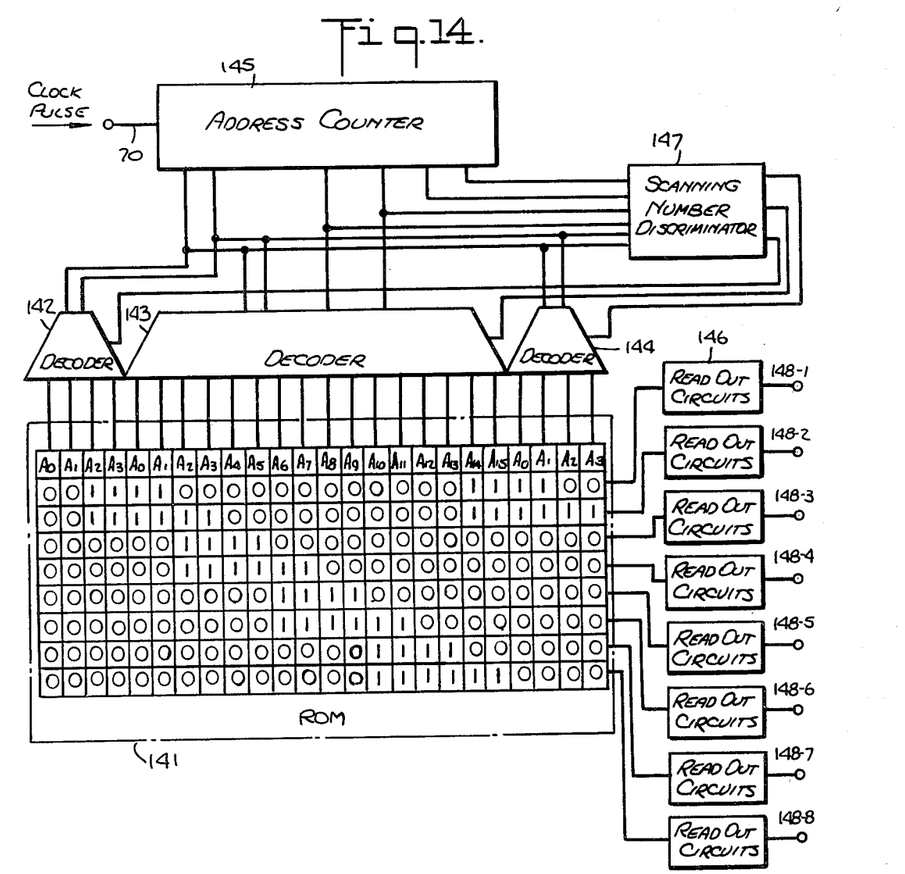

FIG. 14 shows another form of control circuit for use in a magnetic bubble driving device in accordance with this invention which is designed to produce the eight control signals shown in FIG. 8. Construction is similar to the device of FIG. 5. The control circuit of FIG. 14 is comprises of a single ROM 141, decoders 142, 143 and 144, an address counter 145 which receives clock pulses with the repetition period $T_o$ along line 70, and read-out circuits 146. A scanning number discriminator 147 having the same construction as that of FIG. 5 is provided so that it may operate the decoder 142 at the first cycle (rotation) of the rotating magnetic field, the decoder 143 from the second cycle to the cycle that is prior to one cycle from the last cycle, and the decoder 144 at the last cycle. The address counter 145 counts the clock signal from 0 to the number of cycles driven, and constantly sends the results of the counting in the form of binary code to the decoders 142, 143, and 144. Consequently, the memory contents of each word coupled with the decoder selected are sequentially accessed from left to right (looking at FIG. 14), and corresponding electrical signals are delivered to the read-out circuits 146. As a result, control signals having the waveforms 81, 82, 81', 82', 83, 84, 83' and 84' are produced at terminals 148-1 to 148-8, respectively.

The contour of the Lissajous' figure of the periodic coil currents of the present invention approximates the contour of the circular Lissajous' figure which is produced by an ideal resonance circuit driving device but without the problems of such prior art driving devices, such as deterioration of the driving efficiency and irregular variation of the amplitude. Thus, the invention is useful in providing an efficient, low power, low noise magnetic bubble driving system.

The above-described embodiment and variations thereof are given only by way of example of the principles of this invention. Other choices of value or polarity of the voltage supply and arrangements thereof can also be used. Moreover, the diode connections are made to comply with such polarity of the voltage supply, and can accordingly be changed. It is thus to be understood that the particular arrangement and connections shown are for the purpose of detailed illustration, and not for the purpose of limitation of the scope of the invention.

What is claimed is:

1. In a magnetic bubble driving device of the type which includes driving circuits, each having a driving coil wound around a bubble memory unit for producing a rotating magnetic field to the memory unit and a pulse generator for controlling the operation of said driving circuits so that they produce periodic coil currents whose phases are different, said pulse generator being operable to produce periodic pulse signals, at least one of said driving circuits comprising a first switch and a first clamping diode connected in parallel between a first drive coil terminal and a first voltage source terminal, a second switch and a second clamping diode connected in parallel between a second drive coil terminal and said first voltage source terminal, a third switch and a third clamping diode connected in parallel between said first drive coil terminal and a second voltage source terminal and a fourth switch and a fourth clamping diode connected in parallel between said second drive coil terminal and said second voltage source terminal, the combination of a first control circuit connected to receive the pulse signals and to operate said switches in response thereto, such that said first and fourth switches are both closed for a first duration during which a coil current flows from said first to said second drive coil terminal and such that one of said first and fourth switches is opened at the end of said first duration and the other switch is opened at a finite time thereafter; and a second control circuit also connected to receive said pulse signals and to operate said switches in response thereto, such that said second and third switches are both closed for a second duration during which a coil current flows from said second to said first drive coil terminal and such that one of said second and third switches is opened at the end of said second duration and the other switch is opened at a finite time thereafter, whereby a coil current having a trapezoidal waveshape is produced.

2. A magnetic bubble driving device as defined in claim 1, wherein said control circuits are constructed to provide said finite times after said first and second duration of sufficient length so that the rise time of the resulting coil current is equal to the fall time of said current.

3. A magnetic bubble driving device for providing a rotating magnetic field to a magnetic bubble memory comprising drive coils wound around the magnetic bubble memory, electrical driving circuit means for providing periodic electrical currents respectively to said drive coils in different phases with each other, said electrical driving circuit means comprising a four terminal electrical network ($T_1$, $T_2$, $T_3$, $T_4$) with one of said drive coils connected across network terminals $T_1$ and $T_2$, said network including a first switch and a first clamping diode connected in parallel between network terminals $T_1$ and $T_3$, a second switch and a second clamping diode connected in parallel between network terminals $T_2$ and $T_3$, a third switch and a third clamping diode connected in parallel between network terminals $T_1$ and $T_4$, and a fourth switch and a fourth clamping diode connected in parallel between network terminals $T_2$ and $T_4$, means for applying a source of potential across network terminals $T_3$ and $T_4$, and control circuit means for closing and opening each of said switches in a predetermined sequence to produce a periodic current in said one of said coils, said control circuit means serving to control said switches according to the following sequence: (a) during a first time interval said first and fourth switches are ON and said second and third switches are OFF; (b) during a second time interval one of said first and fourth switches is OFF while the other is ON and said second and third switches are OFF; (c) during a third time interval said second and third switches are ON and said first and fourth switches are OFF; and (d) during a fourth time interval one of said second and third switches is OFF while the other is ON and said first and fourth switches are OFF.

4. A magnetic bubble driving device as defined in claim 3, wherein said control circuit means is constructed to effect said switching in accordance with time intervals of a duration such that the rise time of the resulting coil current is equal to the fall time of said current.

5. A magnetic bubble driving device as defined by claim 3, wherein said control circuit means comprises means to turn ON said first and fourth switches at one time at the beginning of said first interval, and means to keep said other of said first and fourth switches ON into said second time interval.

6. A magnetic bubble driving device as defined by claim 5, wherein said control circuit means comprises means to turn On said second and third switches at one time at the beginning of said third interval and means to keep one of said second and third switches ON into said fourth time interval.

7. A magnetic bubble driving device as defined by claim 5 and 6, wherein said control circuit means further comprises means for generating a first electrical signal to control the ON state of said first and fourth switches, means for applying said first electrical signal to said first and fourth switches and first signal delay means to receive said first electrical signal and to apply a delayed first electrical signal to one of said first and fourth switches, whereby said one of said first and fourth switches receives an extended first electrical signal thereby remaining ON longer than said other of said first and fourth switches.

8. A magnetic bubble driving device as defined by claim 7, wherein said control circuit means further comprises means for generating a second electrical signal to control the ON state of said second and third switches, means for applying said second electrical signal to said second and third switches and second signal delay means to receive said second electrical signal and to apply a delayed second electrical signal to one of said second and third switches, whereby said one of said second and third switches receives an extended second electrical signal thereby remaining ON longer than said other of said second and third switches.

9. A magnetic bubble driving device as defined by claim 3, wherein said control circuit means is a digital logic circuit comprising a storage means having separate storage locations for storing respective electrical control signals to control the closing and opening of each switch, electrical output lines electrically connected from each of said storage locations of said storage means to a corresponding one of each of said switches, and means for sequentially reading said respective stored electrical control signals out of said memory and delivering them to the respective electrical output lines.

10. A magnetic bubble driving device for providing a rotating magnetic field to a magnetic bubble memory comprising first and second drive coils wound orthogonally to each other and cylindrically around the magnetic bubble memory, a clock pulse generator for generating clock pulses of a predetermined period, first and second electrical driving circuit means for providing continuous trapezoidal-shaped periodic electrical currents respectively to said first and second drive coils with the periodic currents provided to the separate drive coils being one-quarter of said clock pulse period out of phase with each other, said first and second electrical driving circuit means each comprising a four terminal electrical network ($T_1$, $T_2$, $T_3$ and $T_4$) with said first and second drive coils, respectively, connected across network terminals $T_1$ and $T_2$, each of said networks including a first switch and a first clamping diode connected in parallel between network terminals $T_1$ and $T_3$, a second switch and a second clamping diode connected in parallel between network terminals $T_2$ and $T_3$, a third switch and a third clamping diode connected in parallel between network terminals $T_1$ and $T_4$, and a fourth switch and a fourth clamping diode connected in parallel between network terminals $T_2$ and $T_4$; means for applying a source of potential across network terminals $T_3$ and $T_4$, and control circuit means in synchronism with said clock pulses for controlling the closing and opening of said first, second, third, and fourth switches for a predetermined number of repetitions to produce a resulting periodic coil current according to the following repetitive sequence: (a) said first and fourth switches closed and said second and third switches open for a first one-quarter of said clock pulse period; (b) all of said switches open for a second one-quarter of said clock pulse period, except that one of said first and fourth switches remains closed for an initial portion of said second one-quarter period before becoming open; (c) said second and third switches closed and said first and fourth switches open for a third one-quarter of said clock pulse period; and (d) all of said switches open for a fourth one-quarter of said clock pulse period, except that one of said second and third switches remains closed for an initial portion of said fourth one-quarter period, the initial portions of said second and fourth one-quarters being of equal duration and being of a length such that the rise time of said resulting coil current is equal to the fall time of said current, whereby the resulting coil current assumes a continuous trapezoidal waveform.

* * * * *